US011841383B2

(12) United States Patent
Kranz et al.

(10) Patent No.: US 11,841,383 B2
(45) Date of Patent: Dec. 12, 2023

(54) MAGNETIC CURRENT SENSOR INTEGRATION INTO HIGH CURRENT CONNECTOR DEVICE

(71) Applicant: Infineon Technologies AG, Neubiberg (DE)

(72) Inventors: Theodor Kranz, Sirnitz (AT); Ramdas Ugale, Pune (IN); Gaetano Formato, Villach (AT); Sebastian Maerz, Neubiberg (DE); Dietmar Spitzer, Voelkermarkt (AT)

(73) Assignee: Infineon Technologies AG, Neubiberg (DE)

( * ) Notice: Subject to any disclaimer, the term of this patent is extended or adjusted under 35 U.S.C. 154(b) by 129 days.

(21) Appl. No.: 17/487,314

(22) Filed: Sep. 28, 2021

(65) Prior Publication Data
US 2023/0094577 A1 Mar. 30, 2023

(51) Int. Cl.
*G01R 15/20* (2006.01)
*H01R 4/30* (2006.01)
*G01R 19/10* (2006.01)
*H02K 5/22* (2006.01)
*H02K 11/27* (2016.01)

(52) U.S. Cl.
CPC .......... *G01R 15/202* (2013.01); *G01R 19/10* (2013.01); *H01R 4/30* (2013.01); *H02K 5/225* (2013.01); *H02K 11/27* (2016.01); *H02K 2211/03* (2013.01)

(58) Field of Classification Search
CPC ........ G01R 19/10; G01R 15/202; H01R 4/30; H02K 11/27; H02K 2211/03; H02K 5/225
See application file for complete search history.

(56) References Cited

U.S. PATENT DOCUMENTS

| | | | | |
|---|---|---|---|---|
| 2002/0190703 A1* | 12/2002 | Goto | .................... | G01R 15/202 324/117 H |
| 2013/0119975 A1* | 5/2013 | Nakajima | ............ | G01R 15/202 324/117 R |
| 2013/0147474 A1* | 6/2013 | Nakajima | .............. | G01R 33/07 324/253 |
| 2020/0408809 A1* | 12/2020 | Esaka | .................. | G01R 33/091 |
| 2021/0152057 A1* | 5/2021 | Noguchi | ................ | H02K 11/33 |

* cited by examiner

*Primary Examiner* — Son T Le
*Assistant Examiner* — Adam S Clarke
(74) *Attorney, Agent, or Firm* — Harrity & Harrity, LLP

(57) ABSTRACT

A power connector is provided that is configured to conduct a current. The power connector includes a base structure, an extension structure, and a connector head structure that define a current path for the current. The base structure is coupled to an output node of a primary conductor and receives the current from the primary conductor. The connector head structure is configured to output the current from the power connector to the load. The extension structure is coupled to and extends between the base structure and the connector head structure. The extension structure includes a current constriction region configured to increase a magnetic flux density of a magnetic field produced by the current flowing through the current constriction region at a position of a magnetic current sensor that generates a sensor signal based on the magnetic field magnetic field produced by the current flowing through the current constriction region.

27 Claims, 13 Drawing Sheets

MAGNETIC CURRENT SENSOR INTEGRATION INTO HIGH CURRENT CONNECTOR DEVICE

BACKGROUND

For high current applications and/or applications requiring galvanic isolation between the conductor carrying the test current and the current sensor output, magnetic current sensors are used. For example, magnetic current sensors may be used to determine the phase currents delivered by an inverter power module to an electric motor, or to determine other load currents provided by power distribution systems, electronic fuses, battery monitoring systems, battery disconnect switches, and the like.

These devices sense the test current indirectly by measuring the magnetic flux density created by the test current. Traditional implementations of magnetic current sensors utilize a ferrous core (field concentrator) that is to some degree wrapped around the conductor carrying the test current. The flux density in the field concentrator is proportional to the test current following $Br=\mu 0*\mu r*Itest$. The relative permeability μr of the iron core therefore performs an amplification of the flux density. A linear field probe (e.g. a linear hall sensor) measures the flux produced by the test current and therefore provides a galvanically isolated output signal representing the test current. Other implementations of core-based sensors compensate the flux density produced by the test current via a compensation winding. In this case, the field probe is required to control the resulting flux density to a constant value (e.g., zero), while the compensation current is proportional to the test current.

However, using a core-based magnetic sensor has a number of disadvantages, including cost, complex assembly strategy, inefficiencies in power dissipation, inaccuracies resulting from hysteresis effects and non-linearity of the field concentrator, and saturation effects, overload capability (remanence), weight, and size. For example, to assemble, each current rail of a power module needs to be routed through a field concentrator associated with each magnetic sensor. This adds complexity and bulk to the assembly of the power module.

Coreless current sensors operate without the use of field concentrators. Different to core-based implementations, these sensors directly measure the flux density produced by the test current. By avoiding an iron-core, the drawbacks listed above with respect to core-based magnetic sensors can be omitted. However, the available flux density at the sensitive elements is significantly reduced. Therefore, the sensitive elements need to be placed as close as possible to the conductor. Since current sensors are typically operated in an electromagnetic interference (EMI)-polluted environment (power electronics) it is highly beneficial to implement a differential sensing concept providing intrinsic stray field immunity against distorting fields produced by adjacent elements (semiconductors, capacitors, inductors, conductors).

However, differential sensing is a critical bottleneck in the design of coreless current sensors and different power applications may impose different design constraints on implementing differential sensing. Routing the test current past a differential field sensor also becomes an issue as it is difficult to implement without increasing the size of the device. As a result, manufacturing costs increase in order to accommodate different design and sensing principles. In other words, there is no universal differential sensing solution.

Therefore, an improved device that provides coreless differential current sensing may be desirable.

SUMMARY

One or more embodiments provide a power connector configured to conduct a current of a power device and deliver the current to a load. The power connector includes a conductive frame comprising a base structure, an extension structure, and a connector head structure that define a current path for the current, wherein the base structure is coupled to an output node of at least one primary conductor of the power device, wherein the base structure is configured to receive the current from the at least one primary conductor, wherein the connector head structure is arranged relative to the base structure, wherein the cap structure is configured to mechanically couple the power connector to an electrical interface of the load, and wherein the connector head structure is configured to receive the current from the base structure and output the current from the power connector to the electrical interface of the load, wherein the extension structure is coupled to and extends between the base structure and the connector head structure, wherein the extension structure receives the current from the base structure and delivers the current to the connector head structure, wherein the extension structure includes a current constriction region that is configured to increase a magnetic flux density of a magnetic field produced by the current flowing through the current constriction region relative to a magnetic flux density of a magnetic field produced by the current flowing through a non-current constriction region of the extension structure; and a magnetic current sensor arranged at a position relative to the current constriction region to receive the magnetic field having the increased magnetic flux density produced by the current flowing through the current constriction region, wherein the magnetic current sensor is configured to generate a sensor signal based on the received magnetic field.

One or more embodiments provide a power connector configured to conduct a current of a power device and deliver the current to a load. The power connector includes a conductive frame comprising a base structure, an extension structure, and a connector head structure that define a current path for the current, wherein the base structure is coupled to an output node of at least one primary conductor of the power device, wherein the base structure is configured to receive the current from the at least one primary conductor, wherein the connector head structure is arranged relative to the base structure, wherein the cap structure is configured to mechanically couple the power connector to an electrical interface of the load, and wherein the connector head structure is configured to receive the current from the base structure and output the current from the power connector to the electrical interface of the load, wherein the extension structure is coupled to and extends in first direction between the base structure and the connector head structure, wherein the extension structure receives the current from the base structure and delivers the current to the connector head structure, wherein the extension structure includes a through-hole that extends through the extension structure in a second direction orthogonal to the first direction such that the current flows around the through-hole through two parallel current constriction regions; and a magnetic current sensor arranged in the through-hole, wherein the magnetic current sensor is configured to receive two magnetic fields produced by the currents flowing through the two parallel current constriction regions and generate a sensor signal based on the two received magnetic fields.

One or more embodiments provide an output stage of a power device. The output stage includes a power circuit configured to generate a current; at least one primary conductor coupled to an output of the power circuit, wherein the at least one primary conductor includes an output node and the least one primary conductor is configured to conduct the current from the power circuit to the output node; and a power connector coupled to the output node and configured to transmit the current from the at least one primary conductor to a load.

BRIEF DESCRIPTION OF THE DRAWINGS

Embodiments are described herein making reference to the appended drawings.

DETAILED DESCRIPTION

Figure 1A:
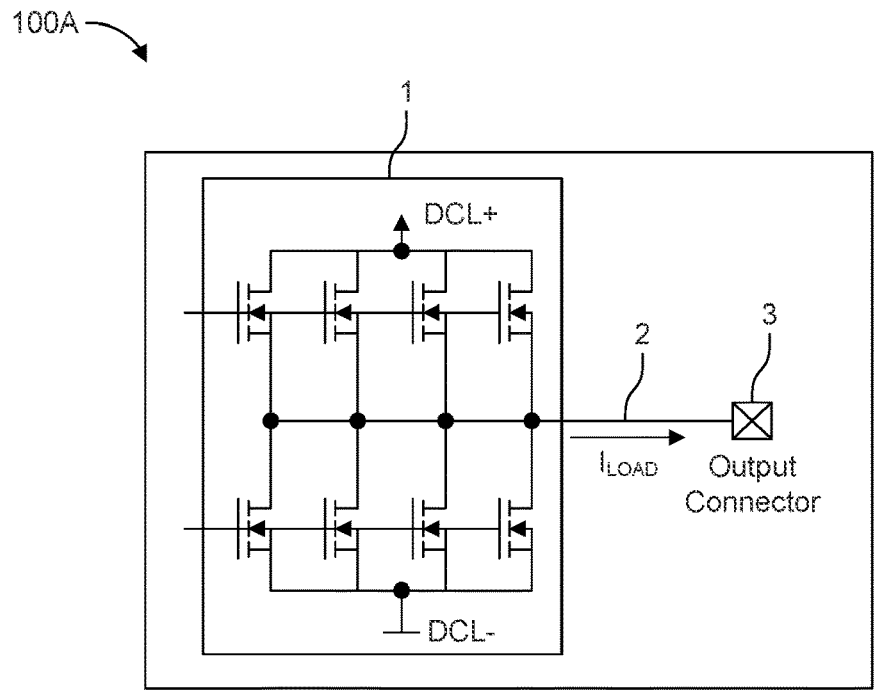
FIGS. 1A-1C are schematic block diagrams illustrating an output stage of a power output device according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration. It is to be understood that other embodiments may be utilized and structural or logical changes may be made without departing from the scope defined by the claims. The following detailed description, therefore, is not to be taken in a limiting sense. Directional terminology used in the claims may aid in defining one element's spatial or positional relation to another element or feature, without being limited to a specific orientation.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The terms "substantially" and "approximately" may be used herein to account for small manufacturing tolerances (e.g., within 5%) that are deemed acceptable in the industry without departing from the aspects of the embodiments described herein. For example, a resistor with an approximate resistance value may practically have a resistance within 5% of that approximate resistance value.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

One or more elements of the present disclosure may be configured by implementing dedicated hardware or a software program on a memory controlling a processor to perform the functions of any of the components or combinations thereof. Any of the components may be implemented as a central processing unit (CPU) or other processor reading and executing a software program from a recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPGAs), programmable logic controller (PLC), or other equivalent integrated or discrete logic circuitry.

Accordingly, the term "processor," as used herein refers to any of the foregoing structures or any other structure suitable for implementation of the techniques described herein. A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure.

A signal processing circuit and/or a signal conditioning circuit may receive one or more signals (i.e., measurement signals) from one or more components in the form of raw measurement data and may derive, from the measurement signal further information. Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Embodiments described herein further relate to differential magnetic field sensors (i.e., differential sensor modules), each of which includes a pair of sensor elements that are configured to generate sensor signals that are to be combined to generate a differential sensor signal, to be described below. The sensor elements may be any type of magnetic field sensor element, including Hall effect sensor elements and magnetoresistive sensor elements. Each sensor element has a plane of sensitivity that may be referred to herein as a "sensitivity-axis" or "sensing axis" and each sensing axis has a reference direction. For example, for Hall sensor elements, voltage values output by the sensor elements change according to the magnetic field strength aligned in the direction of the sensing axis.

Sensor elements that form a differential pair have a same sensing axis (i.e., they are sensitive to the same magnetic field component) but have their reference directions arranged antiparallel to each other. Thus, one sensor element may be sensitive to a +B magnetic field component and the other may be sensitive to a −B magnetic field component. In this way, homogenous and non-homogenous external stray magnetic fields can be canceled out when the differential sensor signal is generated by a sensor circuit.

The magnetic field sensor elements are configured to measure one or more characteristics of a magnetic field (e.g., an amount of magnetic field flux density, a field strength, a field angle, a field direction, a field orientation, etc.). Specifically, the differential magnetic field sensors described herein are implemented as current sensors that measure a magnetic field produced a current-carrying conductor. Each magnetic field sensor element is configured to generate a sensor signal (e.g., a voltage signal) in response to one or more magnetic fields impinging on the sensor element. Thus, a sensor signal is indicative of (i.e., proportional to) the magnitude of the magnetic field impinging on the sensor element.

For example, the magnetic field sensor can be used as a current sensor if it is coupled to a magnetic field generated by some current to be measured which flows through some primary conductor. For example, contactless current measurement can be accomplished by using the magnetic field sensor to sense the magnetic field caused by a current passing through the primary conductor (further referred to as primary current or test current). The magnetic field caused by the primary current depends on the magnitude of the primary current. For example, for a long straight wire carrying a primary current iP the magnitude of the resulting magnetic field H at a distance d from the wire is directly proportional to the primary current iP. In accordance to the Biot-Savart law, the magnitude of the magnetic field H equals $H=iP/(2\pi d)$ if the wire is very long (theoretically infinitely long) as compared to the distance d.

The current sensor may be implemented such that the differential sensor signal is calculated within the sensor module and the differential measurement signal is generated as an output signal. Further, it will be appreciated that the terms "sensor signal", "measurement signal", and "measurement value" may be used interchangeably throughout this description.

According to one or more embodiments, magnetic field sensor elements and a sensor circuit are both accommodated (i.e., integrated) in the same chip package (e.g., a plastic encapsulated package, such as leaded package or leadless package, or a surface mounted device (SMD)-package) and/or on a same circuit substrate, such as a printed circuit board (PCB). Together, the sensor elements and the sensor circuit may be referred to as a magnetic field sensor, sensor module, or sensor device.

The sensor circuit may be referred to as a signal processing circuit and/or a signal conditioning circuit that receives the sensor signals from the magnetic field sensor elements in the form of raw measurement data and derives, from the sensor signals, a measurement signal (e.g., a differential measurement signal) that represents the magnetic field.

Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a sensor output suitable for processing after conditioning.

The sensor circuit may include an analog-to-digital converter (ADC) that converts the analog signals from the sensor elements to digital signals. Alternatively, the sensor circuit may generate the differential measurement signal in the analog domain before converting it into the digital domain. The sensor circuit may also include a digital signal processor (DSP) that performs some processing on the digital signals. Therefore, the sensor comprises a circuit which conditions and amplifies the small signals of the magnetic field sensor elements via signal processing and/or conditioning, and performs additional processing to generate the differential measurement signal.

More particularly, the embodiments are directed to a combination of a power output device that distributes power to a load and a differential magnetic sensor implemented as a current sensor for measuring the load current. Examples of power output devices include power modules, power inverters, power distribution systems, electronic fuses, battery monitoring systems, battery disconnect switches, and the like. For example, a power module may include a single power inverter or n power inverters, hence have one phase or n phases, respectively. The power module may be a high current power module with a signal inverter that includes one current output to drive a load. In an example for implementing n inverters, the power module may be a high current power module that includes three current outputs (i.e., n=3) used to drive each of three phases of an electric motor. For example, the power module may be used for driving a main motor of an electric car. Thus, one or more current sensors may be provided, for example, to measure each current output of the power module.

Embodiments are further directed to a high power device that is coupled to a magnetic sensor by arranging the magnetic sensor within a connector (e.g., within a volume of the connector).

Figure 1B:
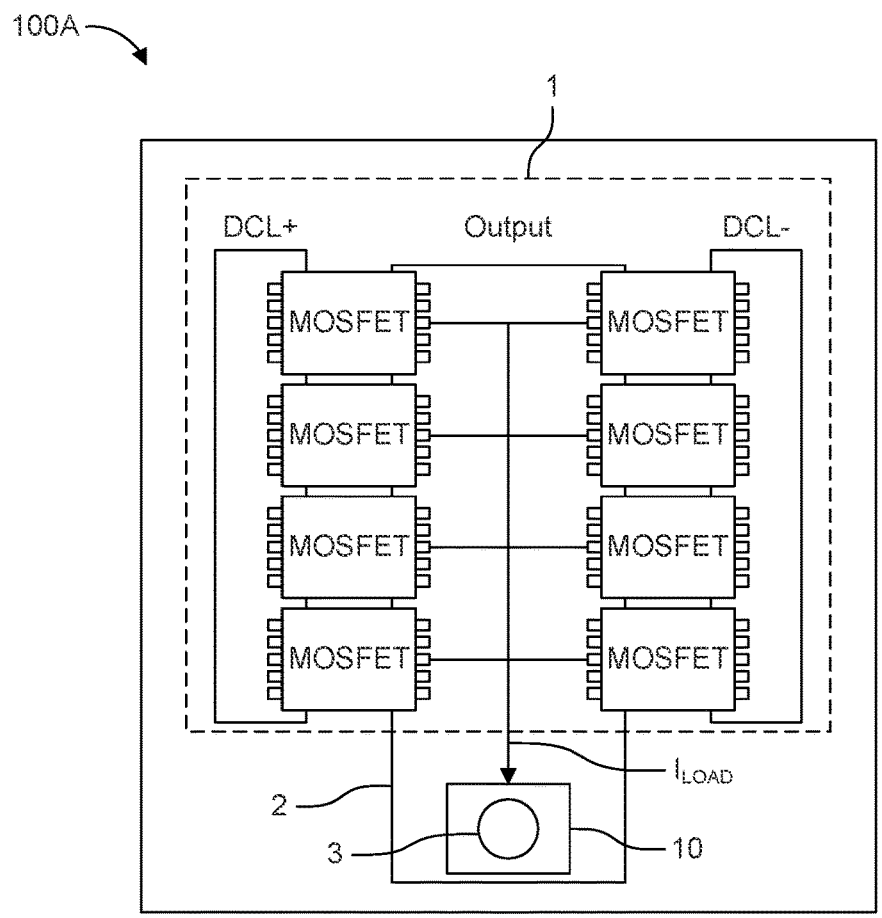

FIGS. 1A and 1B are schematic block diagrams illustrating an output stage 100A of a power output device according to one or more embodiments. In particular, the output stage 100A is and output stage of a power inverter 1 (single phase, n=1). The output stage 100A includes four half-bridge MOSFET devices in parallel between DC link supply rails (DCL+ and DCL−), but is not limited to any particular number of devices. For high voltage applications beyond 100V, IGBTs or SiC FETs can be used instead of standard MOSFETs. A load current LOAD flows along a primary conductor 2 (e.g., a current rail) in the direction of an output node 3 at which an output connector 10 is electrically and mechanically coupled to the primary conductor 2. The primary conductor 2 may be a conductive layer, such as copper, of a power PCB. Furthermore, multiple primary conductors may be present, particularly in a power PCB that comprises multiple power conductive layers that each conduct a portion of the output current.

The output node 3 collects the output current of all power switches of the power inverter 1 and is received by the output connector 10. The output connector 10 is further coupled both mechanically and electrically to a load for delivering power (current) thereto. For example, the output connector 10 may be connected to a motor phase of a motor. Thus, the output connector 10 is configured such that the load current $I_{LOAD}$ flows to the output connector 10 from the primary conductor 2 and further flows through the output connector 10 to the load.

The magnetic field caused by the output current is directly proportional to the magnitude of the output current. In particular, the measured magnetic field represents (i.e., is proportional to) a current density of a current flowing through the primary conductor 2. As will be described in further detail, the output connector 10 includes a current sensor (i.e., a differential magnetic sensor having to differentially spaced sensor elements) that is configured to measure the total output current LOAD of the half-bridge stage of the power inverter 1.

It will be appreciated that in some applications, such as multi-phase motor, the output node 3 may also collect a phase current from the load such that the phase current flows towards the output stage 100A. Thus, the total current that flows through the output connector 10 may be generally referred to as a test current Itest, which includes currents flowing into and out from a load.

Figure 1C:
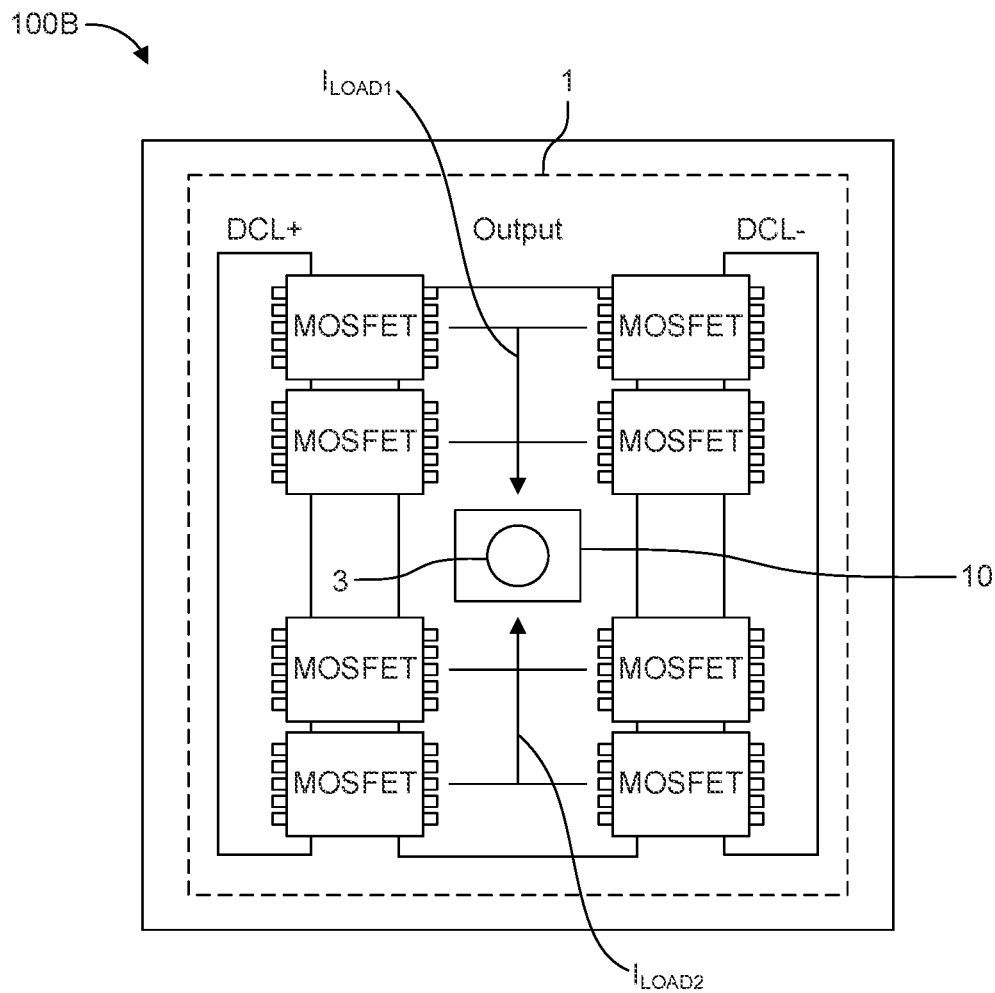

FIG. 1C is schematic block diagrams illustrating an output stage 100B of a power output device according to one or more embodiments. The output stage 100B is a variation of output stage 100A where, instead the output node 3 being arranged at an end of the primary conductor 2 such that all of the half-bridge currents flow in the same direction, the output node 3 is arranged in the middle of the primary conductor 2. In this case, the load current is split into two load currents $I_{LOAD1}$ and $I_{LOAD2}$ corresponding to different ends of the primary conductor 2. The two load currents $I_{LOAD1}$ and $I_{LOAD2}$ combine (superimpose onto each other) at the connector 10 to form a single load current $I_{LOAD1}$ that is provided to a load. Alternatively, in the case that the load current is being sinked to the negative DC link supply rail DCL−, the load current $I_{LOAD1}$ is split into currents $I_{LOAD1}$ and $I_{LOAD2}$ as it enters the primary conductor 2 from the output connector 10. This arrangement also has the benefit of splitting the current density on the PCB and being more compact and thus saving area.

Figure 2:
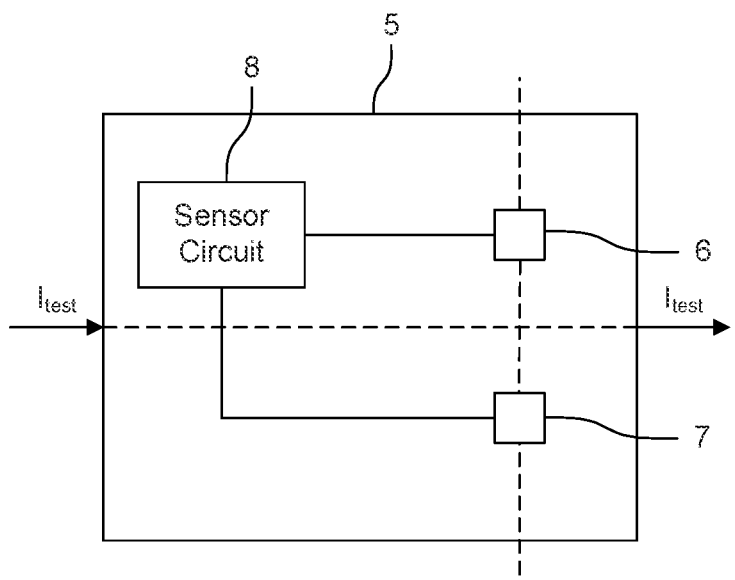
FIG. 2 shows a schematic block diagram of a differential magnetic sensor implemented as a current sensor according to one or more embodiments.

FIG. 2 shows a schematic block diagram of a differential magnetic sensor 5 (e.g., a sensor integrated circuit (IC)) implemented as a current sensor according to one or more embodiments. The differential magnetic sensor 5 includes a pair a sensor elements 6 and 7 that are configured to sense a magnetic field produced by the test current Itest and a sensor circuit 8 that receives the sensor signals generated by the sensor elements 6 and 7. In particular, the differential magnetic sensor 5 is located proximate to the test current Itest. The sensor elements 6 and 7 are differentially placed at different locations on a sensor die. In this example, the differential sensor element pair are two Hall sensor elements that are differentially spaced in a vertical direction with respect to a current flow direction. That is, the sensor elements 6 and 7 straddle opposite sides of the test current Itest and are aligned with each other in a direction that is orthogonal to the current flow direction.

In some embodiments, the sensor elements 6 and 7 are differentially spaced so that the magnetic field impinges upon both sensing elements 6 and 7 with equal magnitude. However, it will be appreciated that other arrangements are possible so long as the sensing elements are located within the magnetic field or at a location where the magnetic field is expected when a current is applied through the primary conductor 2. Thus, the sensor elements 6 and 7 may be non-symmetrically offset from the centered position in some applications.

Together, the pair a sensor elements 6 and 7 generate an analog differential sensor signal (e.g., a differential Hall voltage). In general, the sensor circuit 8 generates the differential sensor signal from the two sensor signals generated by the sensor elements 6 and 7 using differential calculus. As an example, the sensor elements 6 and 7 may be coupled to combining circuitry or combining logic of the sensor circuit 8 that is configured to generate the differential sensor signal. Thus, the combining circuitry of the sensor circuit 8 receives the sensor signals from the sensor elements 6 and 8 and generate the differential sensor signal therefrom. For example, the combining circuitry of may include one or more differential amplifiers that outputs the difference between the sensor elements 6 and 7. A differential sensor signal may provide robustness to homogenous and non-homogenous external stray magnetic fields, and may provide more accurate measurements compared to a monocell sensor configuration. Despite this advantage, the embodiments are not limited to the magnetic sensor being a differential magnetic sensor and can be a monocell magnetic sensor with a single sensor element (e.g., sensor element 6 or 7).

FIGS. 3A-3D show various perspective views of an output connector 10A according to one or more embodiments. The output connector 10A includes through-holes 11a and 11b at one end and a threaded through-hole 12 at the opposite end.

The through-holes 11a and 11b extend through a base plate 13 of the output connector 10A and are configured receive fasteners (e.g. bolts or screws) that both mechanically and electrically couple the base plate 13 to the primary conductor 2. In particular, the primary conductor 2 may likewise have through-holes aligned with through-holes 11a and 11b so that the base plate 13 can be fastened to the primary conductor 2Due to the conductive fasteners extending through the power PCB, the output connector 10A can be configured to provide a massive interface to all power layers on the power PCB for receiving the total output current therefrom. Other interface schemes other fasteners, such as press fit pins, SMD, or through-hole solder connections may be used. In general, all assembly techniques known from standard connectors (SMD, through-hole technology (THT), press-fit, etc.) can be implemented.

The threaded through-hole 12 is configured to receive a conductive fastener, such as a threaded bolt or screw, that mechanically and electrically couples the output connector 10A to the load. Other types of connecting elements may be used for mechanically and electrically connecting the connector to the load and is not limited to a through-hole/fastener arrangement. For example, a pin or a clip could also be used. As such, a conductive path 14 is formed between the primary conductor 2 and the load, and, more particularly, between the base plate 13 and the through-hole 12 through which the test current Itest flows. The conductive path 14 may flow along the base plate 13 in one direction, according to the arrangement shown in FIG. 1B, or may flow along the base plate 13 in two, split directions, according to the arrangement shown in FIG. 1C.

The base plate 13 is part of a conductive structure of the output connector 10. The top/bottom main surfaces of the base plate 13 define two planes that are parallel to the current flow direction of the test current Itest. The base plate 13 is designed to collect the test (output) current Itest from the primary conductor 2 (e.g., the power PCB structure). An extension plate 15 of the conductive structure extends orthogonally from one side of the base plate 13 and, consequently, also orthogonally from the primary conductor 2. The test current Itest is routed from the base plate 13, through the extension plate 15, to the fastener that is coupled to the threaded through-hole 12. Thus, the extension plate 15 forms a conductive bridge between the base plate 13 and a connector head 16 of the connector 10A.

The connector head 16 of the conductive structure extends vertically upward from the extension plate 15 and may partially extend laterally over part of the conductive path 14 of the base plate 13. In other words, a lateral dimension of the head 16 parallel to the current flow along the base plate 13 may be greater than a lateral dimension of the extension plate 15 such that a recess, cavity, or connector volume is formed at both lateral sides of the extension plate 15. The recesses may be used to receive a circuit substrate 17 on one side of the extension plate 15 and a stabilization plate 18 on the other side of the extension plate 15. The differential magnetic sensor 5 may be connected to the circuit substrate 17 such that it is arranged between the circuit substrate 17 and the extension plate 15. The circuit substrate 17 is electrically coupled to the differential magnetic sensor 5 and is configured to receive a differential sensor signal from the sensor circuit 8 and output the differential sensor signal to an external device. The circuit substrate 17 and the stabilization backplate may be fastened to the extension plate 15 using through-holes 19 that laterally extend through the extension plate 15 and respective fasteners. The differential magnetic sensor 5 is used with the connector as a coreless-based current sensor—meaning that no field concentrator external to the current path under test is used.

The connector head 16 accommodates the through-hole 12, which extends (lengthwise) in a direction parallel to the extension plate 15. Together, the base plate 13, the extension plate 15, and the connector head 16 form the conductive structure of the connector 10A as a one-piece integral construction. The base plate 13, the extension plate 15, and the connector head 16 forms a T-shape and therefor may be referred to as a T-connector.

The extension plate 15 has a constriction region having zig-zig shape (e.g., a Z-shape or an S-shape) comprising an inverted S-bend or an S-bend depending on which sides the cut-outs 21a and 21b are made. Here, an inverted S-bend is shown. However, the cut-outs 21a and 21b could be inverted to make an S-bend. For the purpose of this disclosure, the term "S-bend" refers to both inverted and non-inverted orientations.

The cut-outs 21a and 21b are differentially displaced from each other along the vertical trajectory of the conductive path 14 (i.e., along the lengthwise dimension of the extension plate 15 that extends from the base plate 13 to the connector head 16). Additionally, the cut-outs 21a and 21b extend inwardly from opposite lateral sides of the extension plate 15, thereby forming the inverted S-bend or an S-bend. Furthermore, the cut-outs 21a and 21b may partially overlap in the lengthwise dimension of the extension plate 15. In other words, their most inward edges may overlap in the vertical direction so that the conductive path 14 cannot strictly flow in a straight line in the vertical direction but must instead alter its path to navigate around the cut-outs 21a and 21b.

At the center region of the inverted S-bend or an S-bend, the extension plate 15 further includes a current constriction structure 22 (i.e., a current constriction region). The current constriction structure 22 is a middle segment of the inverted S-bend or the S-bend that connects the bottom segment (base segment) of the S-bend that is directly coupled to the base plate 13 to the top segment (head segment) of the S-bend that is directly coupled to the connector head 16. The current constriction structure 22 is a narrowed, constricted structure that extends horizontally across the extension plate 15 (i.e., along a widthwise dimension of the extension plate 15 from one lateral side to the other, opposite lateral side). For example, the middle segment of the S-bend is a lateral, constricting segment.

As a result of the zig-zag conductive pathway (S-shape or inverted S-shape), the test current Itest is forced to wind through the constriction region of the extension plate 15. In particular, the inverted S-bend or an S-bend shape of the extension plate 15 concentrates all of the test current Itest through the narrowed current constriction structure 22, thereby increasing the current density of the test current Itest at that passageway and thereby increasing the magnetic flux density produced therefrom. This stronger magnetic field facilitates its detection by the sensor elements 6 and 7 and allows for more accurate current measurements to be taken.

Figure 3A:
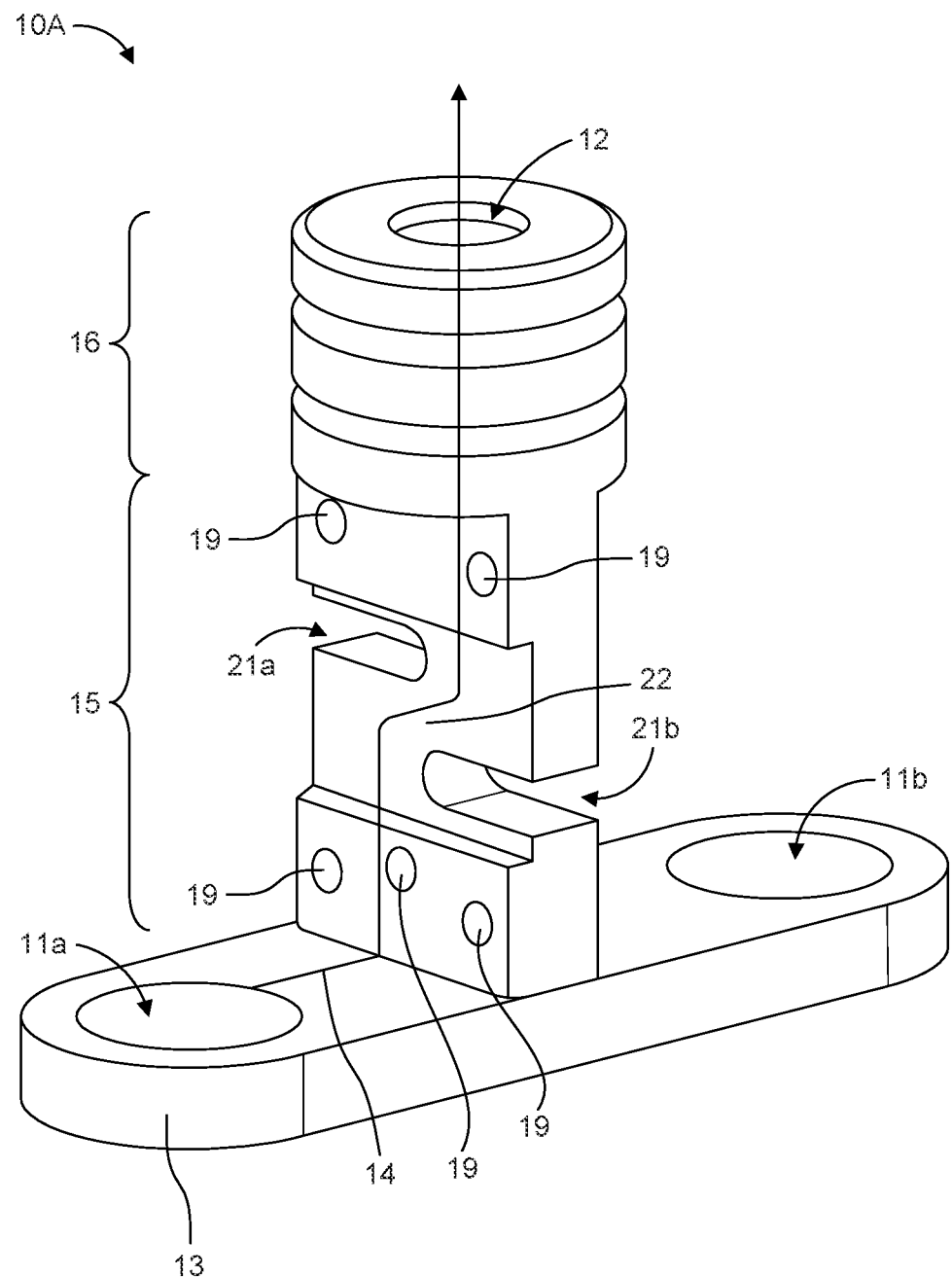
FIGS. 3A-3D show various perspective views of an output connector according to one or more embodiments.
Figure 3B:
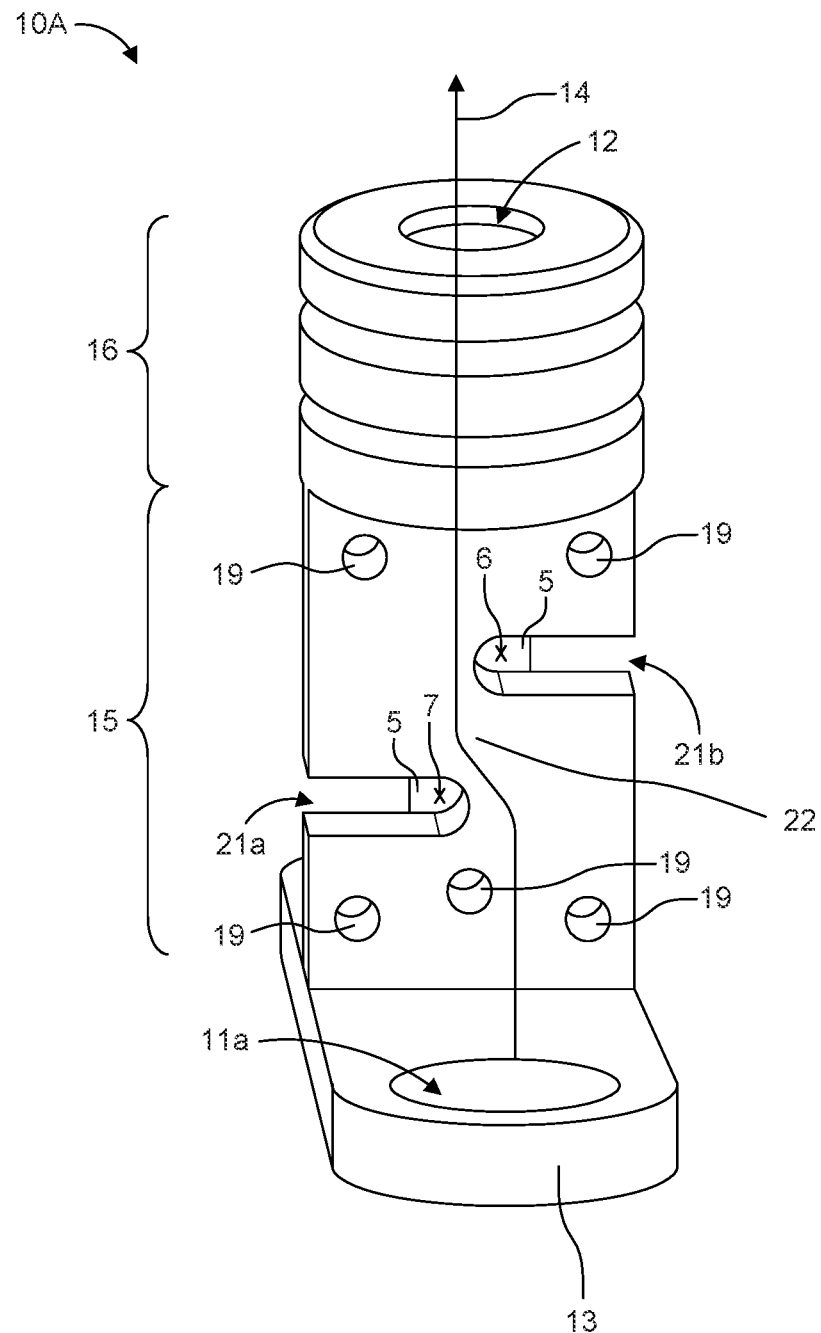

In the alternative to the current constriction structure 22 being an S-bend structure, the current constriction structure 22 may have other shapes or configurations. For example, the current constriction structure 22 may diagonally extend from the base plate 13 to the connector head 16. Alternatively, the current constriction structure 22 may vertically extend from the base plate 13 to the connector head 16 in an I-shape or an I-configuration, as shown in FIGS. 3E and 3F. In FIGS. 3E and 3F, the cut-outs 21a and 21b are symmetrically opposed to one another, with the narrowed current constriction structure 22 interposed between, such that the extension plate 15 has an I-shape. The current I becomes funneled through the narrowed current constriction structure 22, thereby increasing its current density. The sensor elements 6 and 7 are differentially spaced in the current constriction region and are configured to measure the differential magnetic field.

Alternatively, the current constriction structure 22 may be C-shaped. In each case, the current constriction structure 22 includes a constriction segment that is configured to cause a defined magnetic field of the output current to flow through the current constriction structure 22 (i.e., through the constriction segment) at a position of a magnetic current sensor 5 and more particularly at a position of the one or more sensor elements 6 and/or 7.

In the case that the magnetic current sensor 5 is a differential sensor, the differential pair of sensor elements 6 and 7 are differentially arranged with respect to the constriction segment of the current constriction structure 22. The sensor elements 6 and 7 of the differential sensor may be aligned with each other in a direction that is orthogonal to a current flow of the output current flowing through the constriction segment. For example, sensor element 6 may be arranged at a region of the cut-out portion 21a that vertically overlaps with the cut-out portion 21b. Likewise, sensor element 7 may be arranged at a region of the cut-out portion 21b that vertically overlaps with the cut-out portion 21a such that sensor elements 6 and 7 are aligned in the vertical direction. In this way, the sensor elements 6 and 7 straddle the current flowing through the current constriction structure 22 in a region where the magnetic flux density has been increased by the current constriction structure 22. In FIG. 3B, the magnetic current sensor 5 (i.e., sensor IC) is shown arranged behind the extension plate 15 and possible locations are marked for sensor elements 6 and 7. Here, the sensor elements 6 and 7 do not quite vertically overlap but are still differentially spaced with respect to the current flowing through the current constriction structure 22.

While several current constriction structures are possible to be implemented into the connector design (e.g., straight, lateral, C-shaped, I-shaped, vertical, diagonal) as an alternative to the S-bend shape, implementing a lateral current constriction structure with horizontal current flow as shown is beneficial to maintain mechanical strength of the connector 10A against applied torque by the connector screw that is fastened to the connector 10A via the through-hole 12. Maintaining a horizontal section for the residual current path 14 provides the required mechanical strength against deformation due to the application of external torque.

The test current Itest is then conducted via the current constriction structure 22, which creates a differential magnetic field to be sensed by the differential magnetic sensor 5. In particular, because the cut-outs 21a and 21b straddle opposite sides of the current constriction structure 22, they also straddle opposite sides of the test current Itest flowing through the current constriction structure 22. Furthermore, because the inner end portions of cut-outs 21a and 21b straddle the current path 14, the inner end portions of the cut-outs 21a and 21b provide a good location for arranging the sensor elements 6 and 7 in a differential configuration.

Figure 3C:
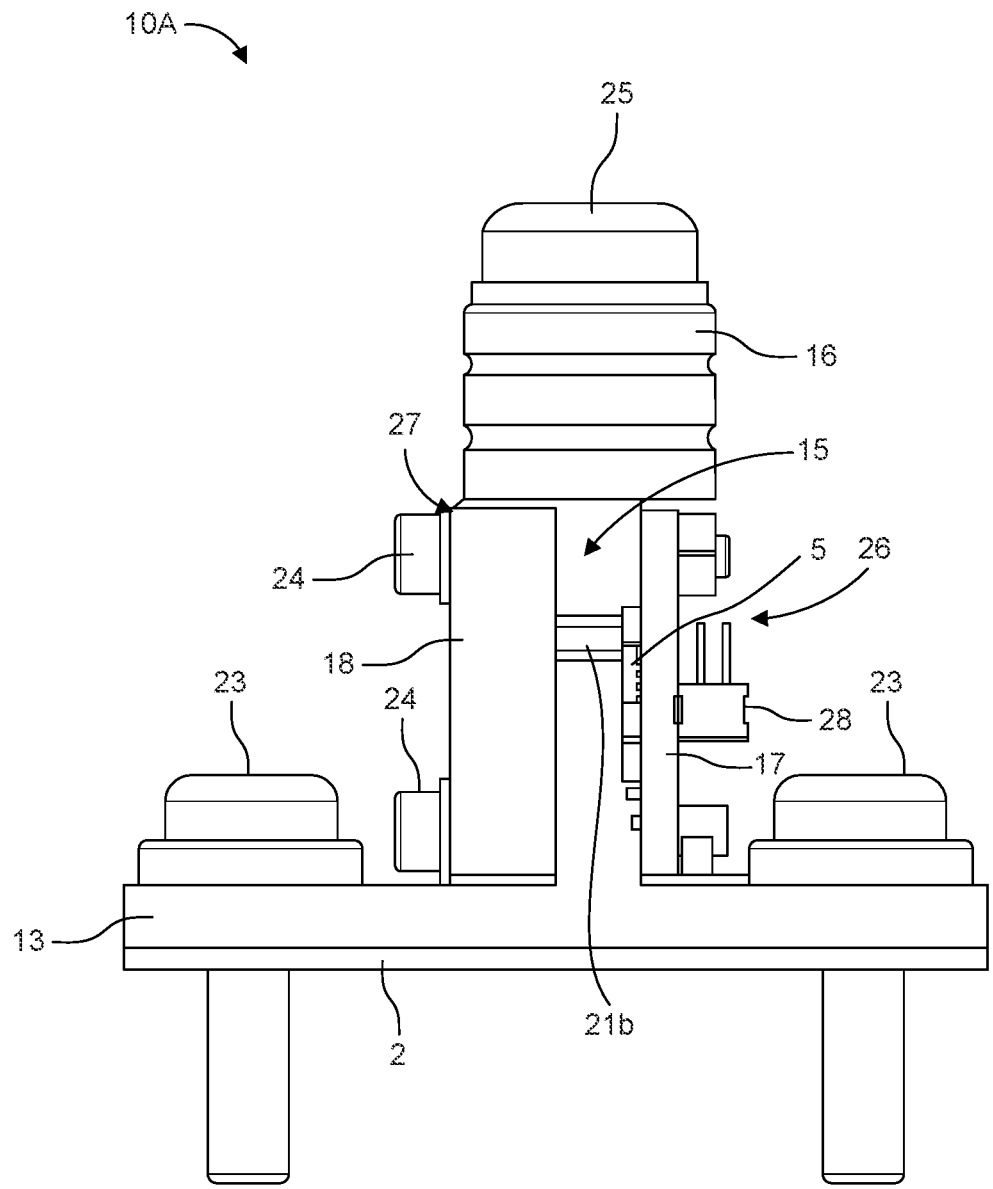
Figure 3D:
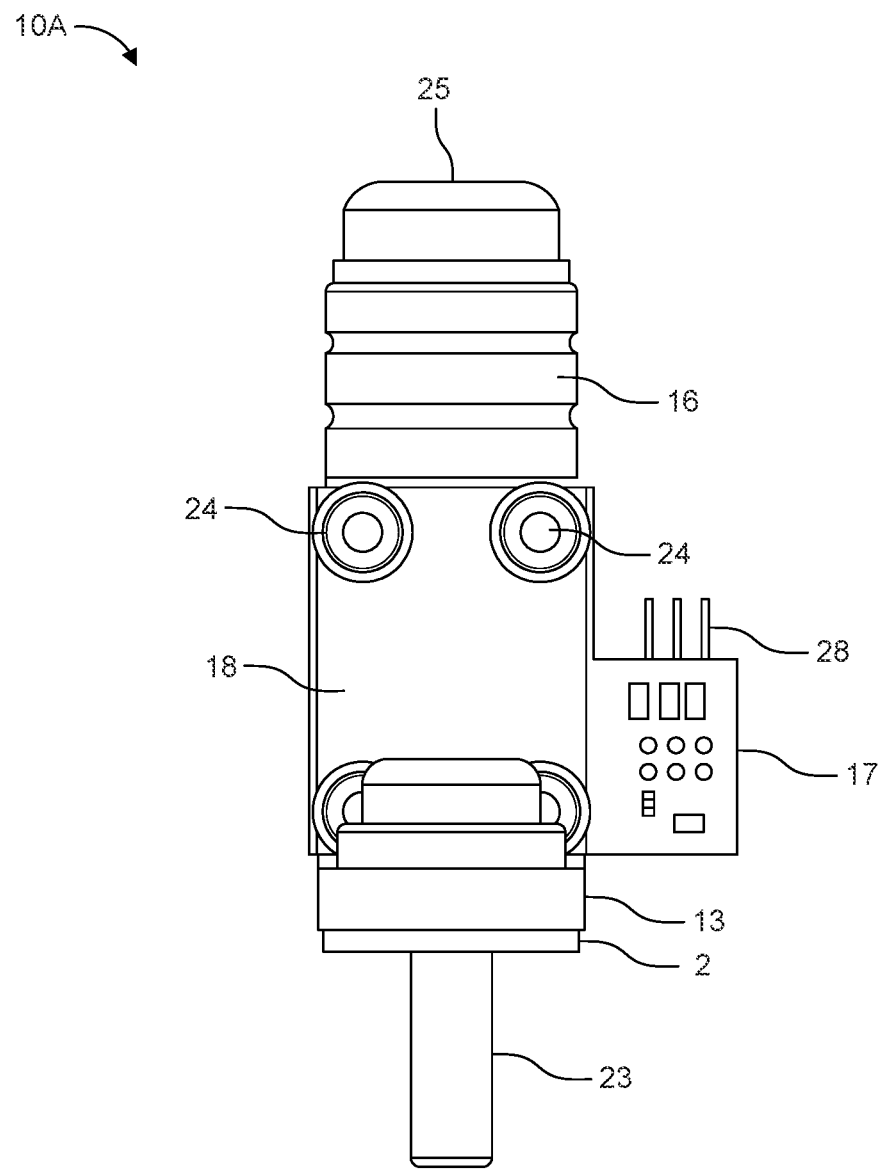
Figure 3E:
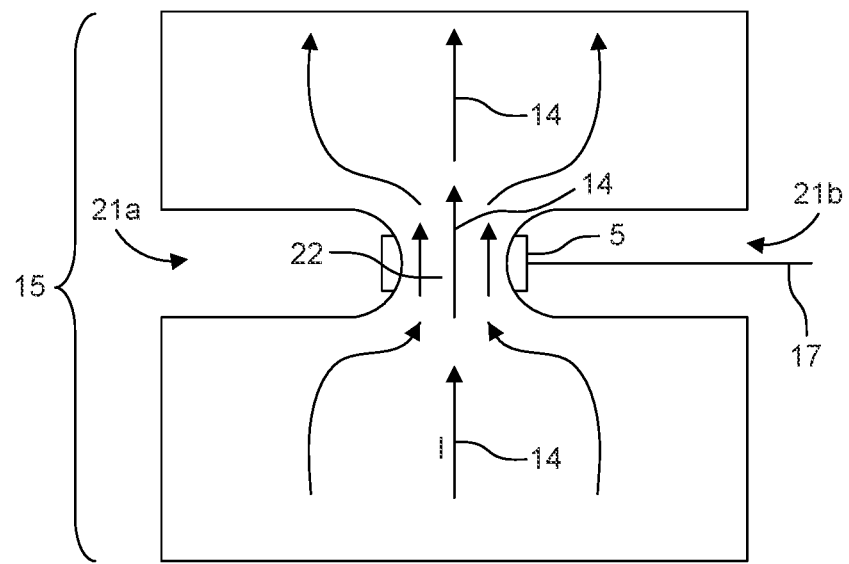
FIGS. 3E and 3F show an alternative configuration of an extension plate of an output connector according to one or more embodiments.
Figure 3F:
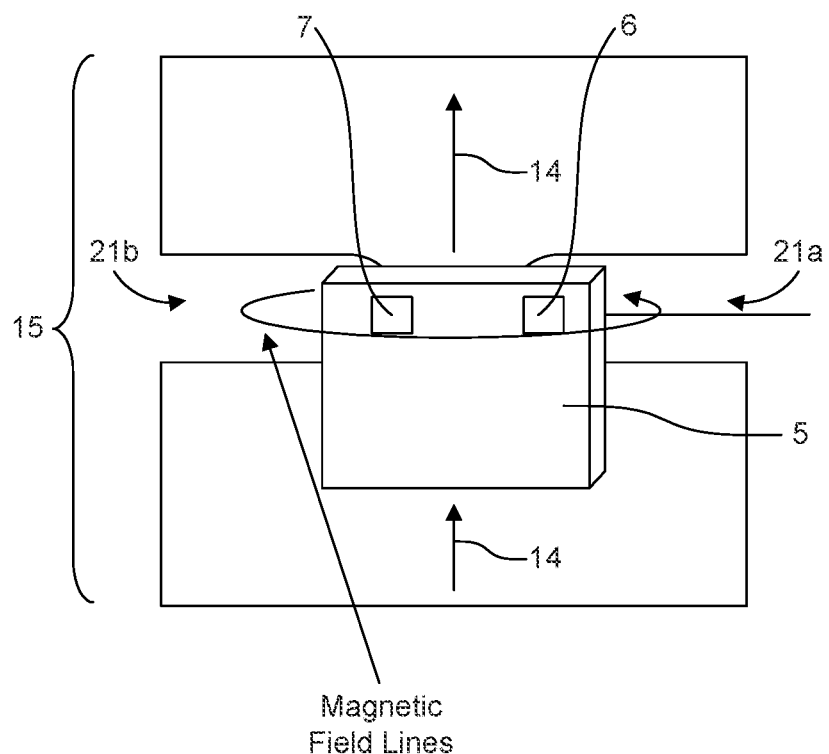

FIG. 3C provides a side view of the connector 10A and FIG. 3D provides a front view of the connector 10A. The magnetic current sensor 5, the circuit substrate 17 for the magnetic current sensor 5, the stabilization plate 18, base plate fasteners 23, extension plate fasteners 24, and connector head fastener 25 are also shown in FIGS. 3C and 3D.

The base plate fasteners 23 are arranged in through-holes 11a and 11b to fasten the base plate 13 to the primary conductor 2 and the power PCB. The extension plate fasteners 24 are arranged in through-holes 19 and are used to fasten the circuit substrate 17 and the stabilization plate 18 to the extension plate 15, with the magnetic current sensor 5 being arranged adjacent to the extension plate 15. The connector head fastener 25 is arranged in through-hole 12 and is used to fasten the connector head 16 to the load or a load line thereof. The connector head fastener 25 is a mounting structure (e.g., screw or bolt) implemented to connect to an electrical interface of the load, such as a wire, a busbar, or other means for connection to the load. The connector itself is arranged between the primary conductor 2 and the load and serves as an electrical conduit therebetween. The connector head 16 collects the current from the extension plate 15 and provides the current to the load. The connector head fastener 25 may also be used to collect the current.

The connector head 16 laterally extends from the extension plate 15 and hangs over the base plate 13 in both lateral directions to form a connector recess 26 on the back side of the extension plate 15 and a connector recess 27 on the front side of the extension plate 15. The connector recess 26 is configured to receive the circuit substrate 17 therein such that the circuit substrate 17 can be coupled to the back side of the extension plate 15.

Current sensor PCB 17, along with the sensor 5, is embedded in the connector 10A. Namely, the circuit substrate 17 is arranged such that its magnetic current sensor 5 is arranged between the circuit substrate 17 and the extension plate 15. In particular, the magnetic current sensor 5 is arranged in the region of the current constriction structure 22 and may be separated therefrom by a small spacer gap (e.g., an air gap) to provide electrical isolation between the extension plate and the magnetic current sensor 5. Alternatively, an optional isolation layer (not illustrated) may be provided between the sensor 5 and the current constriction structure 22 to provide electrical isolation between the extension plate 15 and the magnetic current sensor 5. The sensor elements 6 and 7 are arranged to straddle the current flowing through the current constriction structure 22. The circuit substrate 17 further includes an output connector 28 that is configured to output the sensor signal from the magnetic current sensor 5 to and external device.

The connector recess 27 is configured to receive the stabilization plate 18. The stabilization plate 18 is made of a non-magnetic, non-conductive material, such as plastic, so as not to interfere with the current measurement. The current sensing implementation requires a concentration of the current into a relatively narrow cross section (current constriction structure 22) that is defined by the cut-outs 21a and 21b. The stabilization plate 18 can be provided to ensure the mechanical integrity of the output connector 10, thereby adding mechanical strength to the connector 10A in the X-Y lateral directions against tightening/un-tightening forces (i.e., torque forces). Namely, the stabilization plate 18 provides additional mechanical strength against torque applied when tightening/un-tightening the connector screw that is fastened to the connector 10A via the through-hole 12.

Figure 4A:
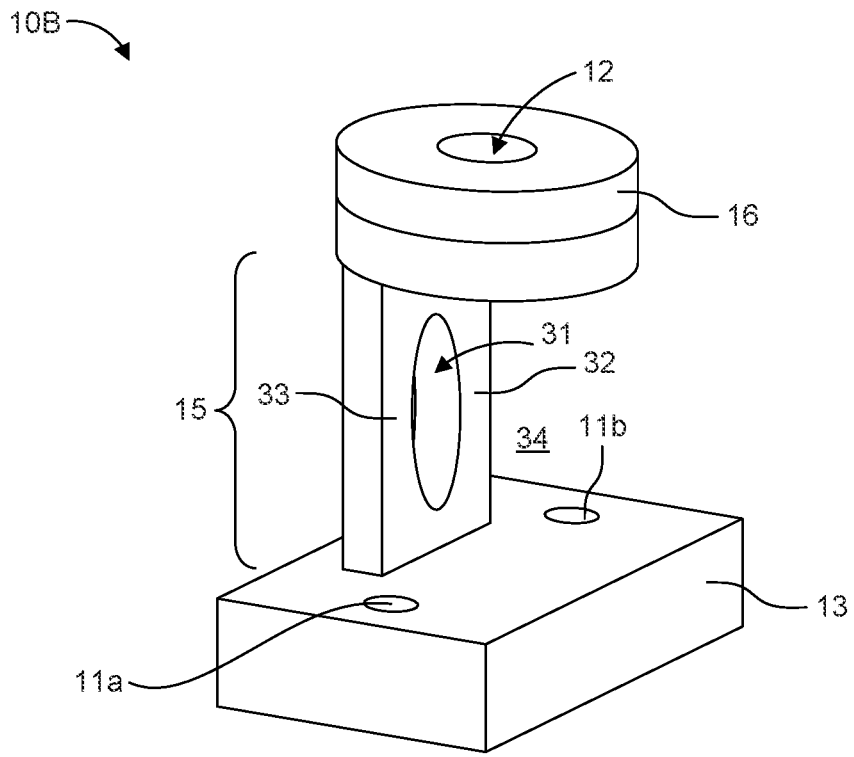
FIGS. 4A-4D show various perspective views of another output connector according to one or more embodiments.
Figure 4B:
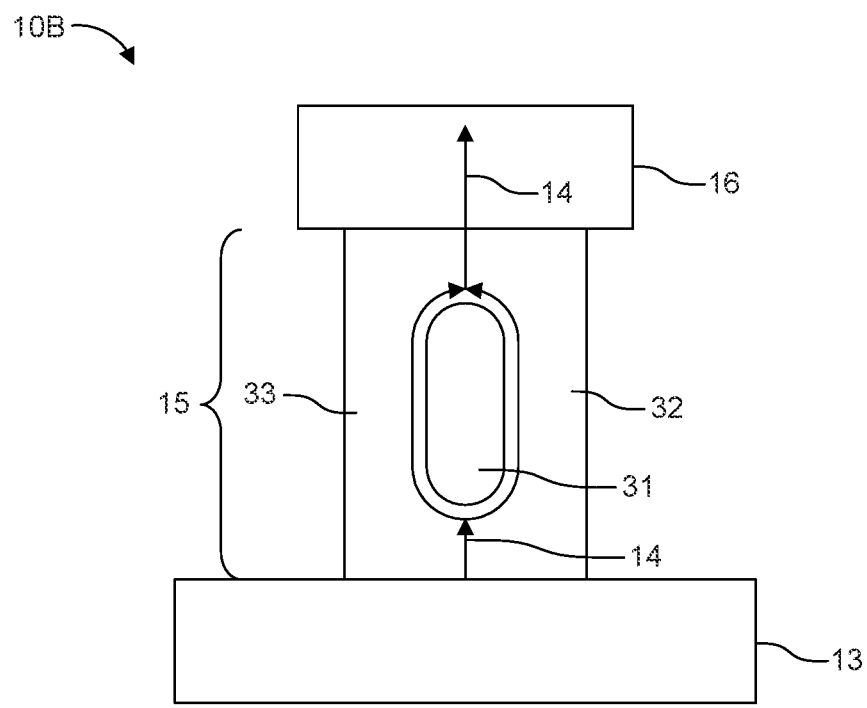
Figure 4C:
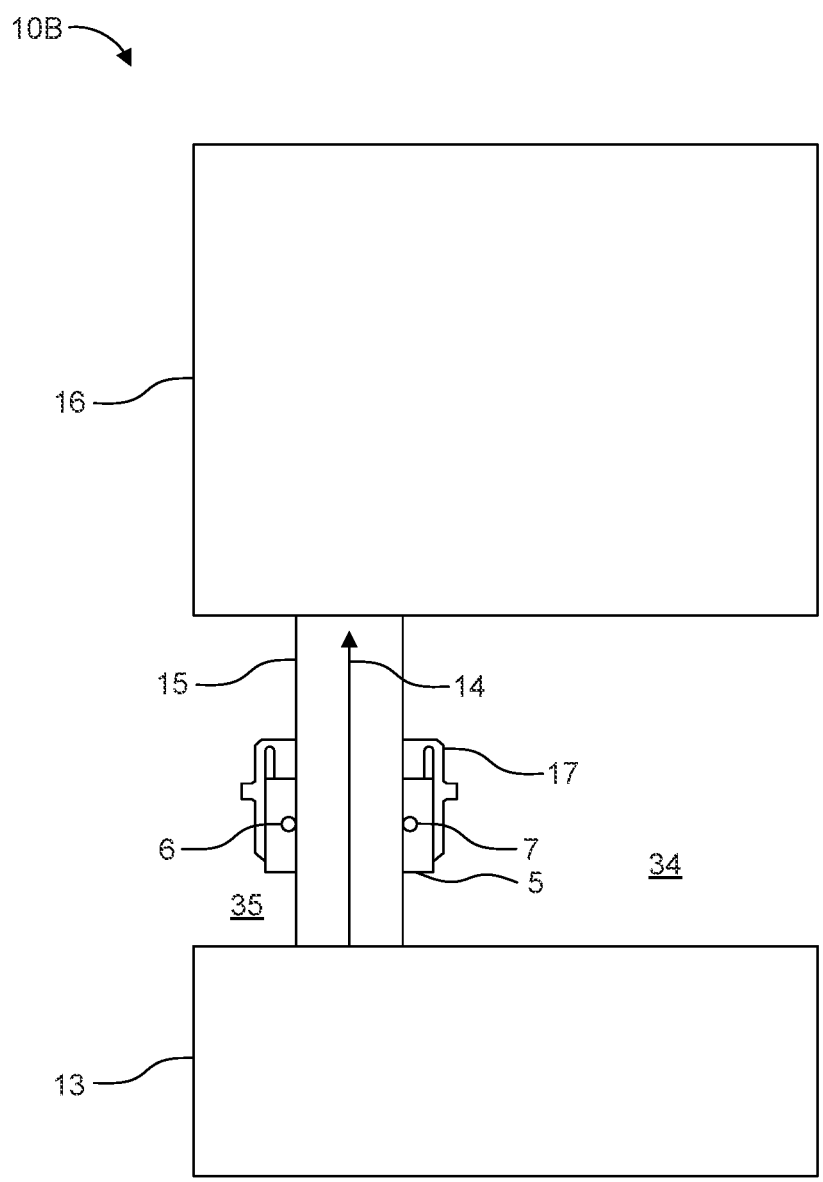
Figure 4D:
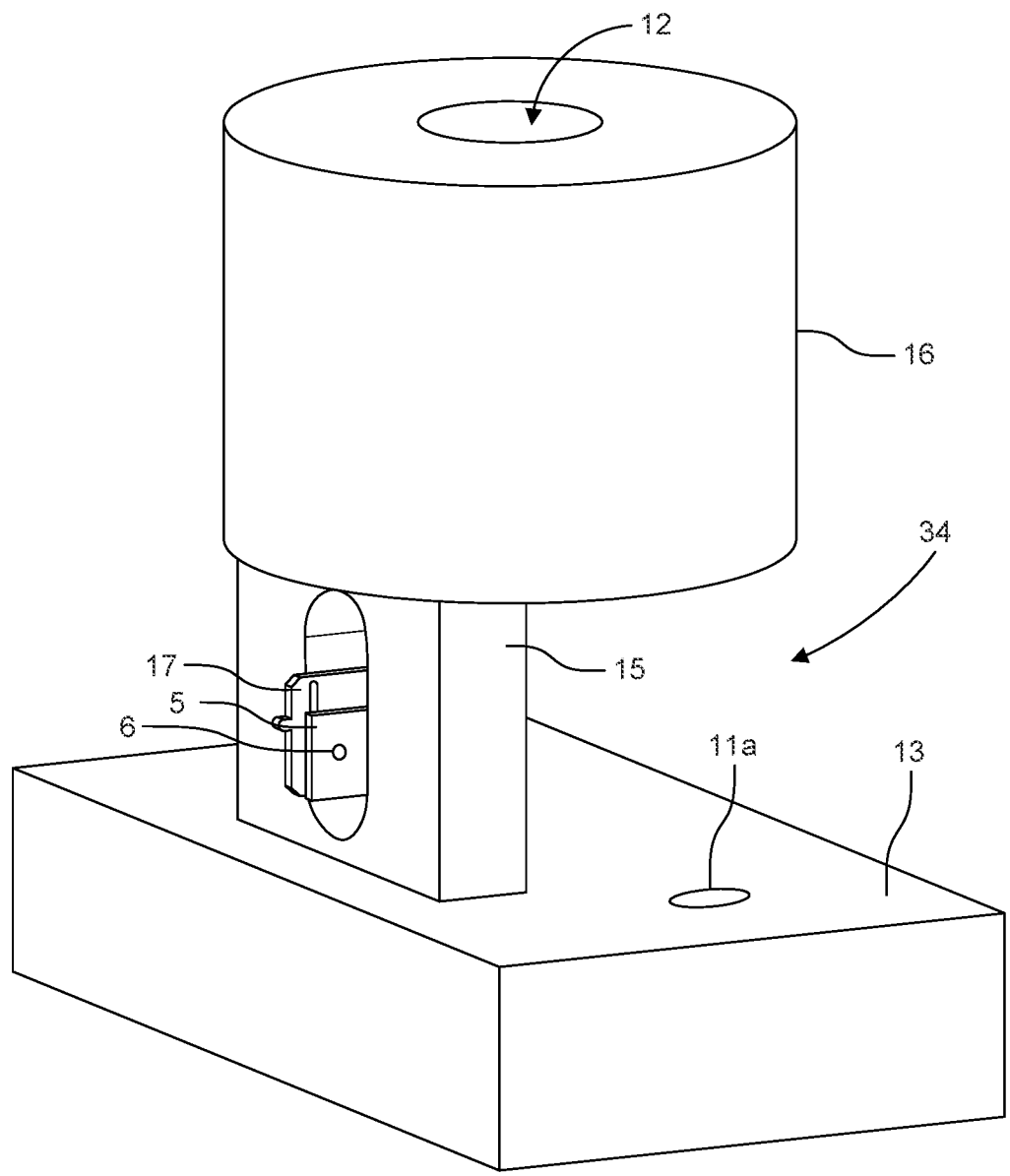
Figure 4E:
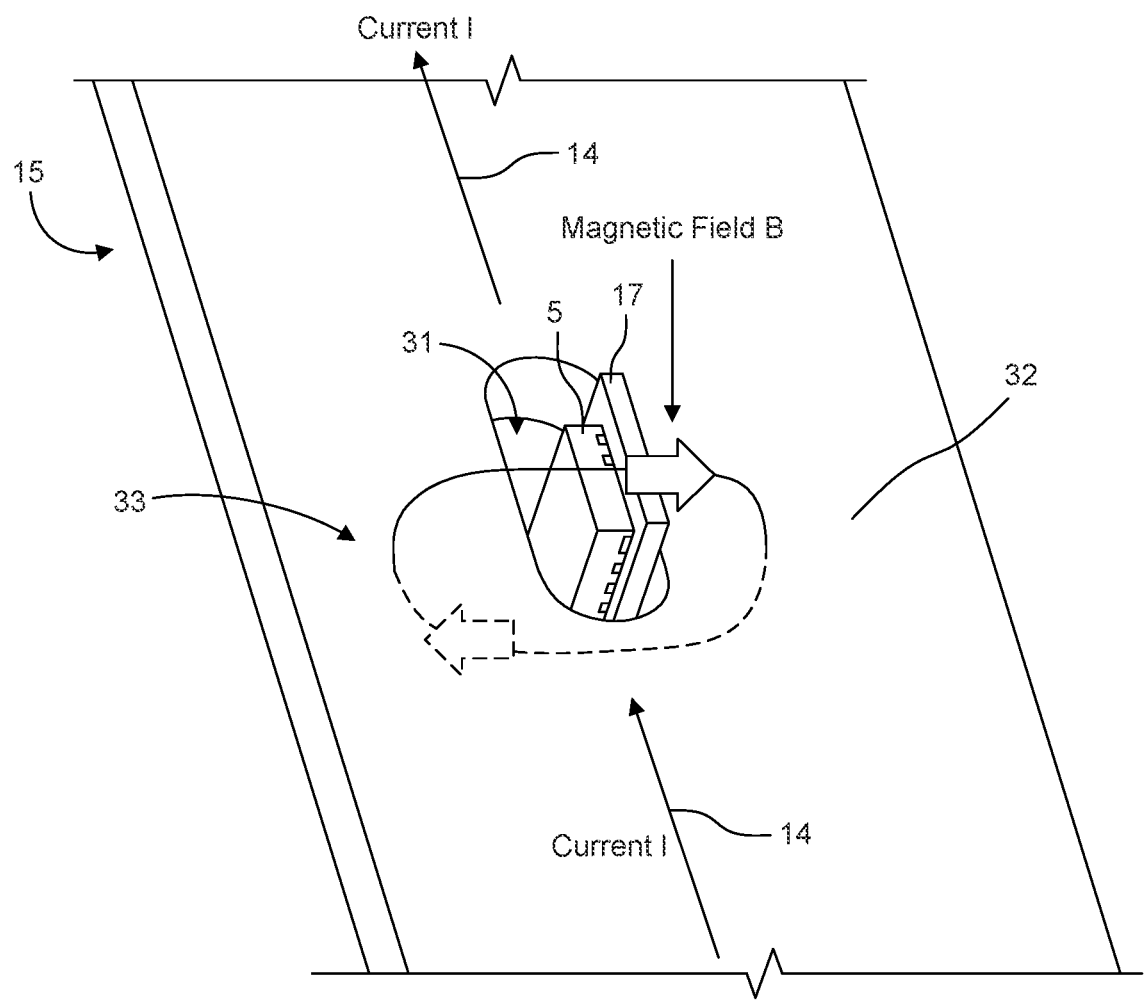
FIG. 4E illustrates a differential magnetic sensing principle generated by a current flowing through an extension plate of the output connector shown in FIGS. 4A-4D.

FIGS. 4A-4D show various perspective views of an output connector 10B according to one or more embodiments. FIG. 4E illustrates a differential magnetic sensing principle generated by a current I flowing through an extension plate of the output connector 10B shown in FIGS. 4A-4D. The output connector 10B shares similar elements to that of output connector 10A that will not be repeated. For example, the core features of a base plate 13, an extension plate 15, and a connector head 16 with a through-hole 12 are still present.

However, instead of having cut-outs 21a and 21b to create a current constriction structure 22, the extension plate 15 of output connector 10B has a through-hole 31 that extends laterally therethrough. The through-hole 31 has an elongated or slit shape whose longest dimension extends in the vertical direction parallel to the current path 14 (i.e., in the direction that extends from the base plate 13 to the connector head 16). Due to through-hole 31, two parallel current constriction structures 32 and 33 are formed in the extension plate 15 that provide two parallel current paths for current to flow between the base plate 13 and the connector head 16. The two parallel current constriction structures 32 and 33 have equal dimensions so that the currents flowing therethrough are equal. The through-hole 31 is configured to cause a defined magnetic field of the current flowing through the extension plate 15 at a position of the sensor elements 6 and 7.

As before, the connector head 16 laterally extends over the base plate 13 to form a connector volumes 34 and 35 or recesses at each lateral side (front and back side) of the extension plate 15.

The through-hole 31 is used for integrating the magnetic current sensor 5 in the connector 10B. Specifically, the magnetic current sensor 5 is inserted through the through-hole 31 so that its sensor elements 6 and 7 are differentially spaced with respect to the current flowing through extension plate 15 along the current path 14. For example, the interior side walls of the extension plate 15 that define the through-hole 31 surround the magnetic current sensor 5. One sensor element 6 may be arranged outside the through-hole 31 on one lateral side (e.g., back side) of the extension plate 15 and the other sensor element 7 may be arranged outside the through-hole 31 on the other lateral side (e.g., front side) of the extension plate 15. At least a portion of the through-hole 31 is interposed between the sensor elements 6 and 7. In this example, the entire through-hole 31 is interposed between the sensor elements 6 and 7. Thus, the differential pair of sensor elements 6 and 7 are differentially arranged with respect to the through-hole and the current measured by the two sensor elements 6 and 7 flows in an area interposed between the two sensor elements 6 and 7.

The connector volumes 34 and 35 may be used to house the magnetic current sensor 5 inside the connector 10B. In addition, a stabilizing plate may also be integrated within one of the connector volumes 34 or 35 to provide additional mechanical strength to the connector 10B.

FIG. 4E illustrates a differential magnetic sensing principle generated by a current I flowing through the extension plate 15 of the output connector 10B. The location and shape of the through-hole 31 causes the current to generate a differential magnetic field B that impinges the sensor elements 6 and 7 that are differentially arranged on either side of the extension plate 15. The magnetic current sensor 5 is electrically isolated from the extension plate 15 in that it does not make direct contact therewith.

In particular, the through-hole 31 not only enables the mounting to the magnetic sensor into the extension plate but also creates two parallel current paths along either side of the through-hole 31. These two parallel current paths are smaller in area (i.e., narrowed current pathways) and thus are current constriction paths that concentrate the current density of the current flowing therethrough and thereby increase the magnetic field at the locations of the sensor elements 6 and 7.

Non-conductive filler material (not illustrated), such as molding, may also be injected into and cured in any of the following: connector recesses 26, 27, connector volumes 34, 35, cut-outs 21a, 21b, and through-hole 31. The filler material may be used to fill the above-noted openings in order to protect the magnetic current sensor 5, provide added mechanical strength to the connectors, and/or provide isolation of the low voltage domain (i.e., the sensor output) from the power domain.

Figure 5:
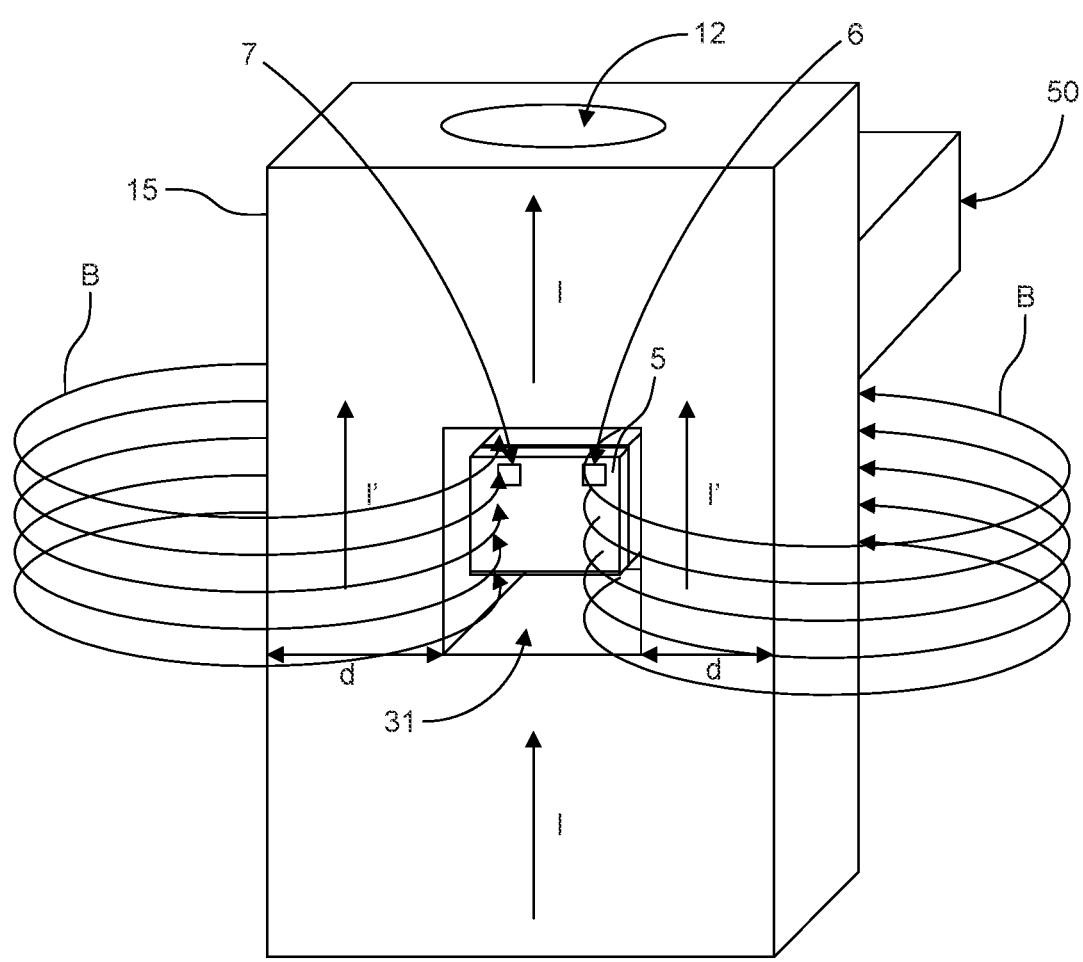
FIG. 5 illustrates an alternative configuration of an extension plate of an output connector according to one or more embodiments.

FIG. 5 illustrates an alternative configuration of an extension plate of an output connector according to one or more embodiments. Like FIGS. 4A-4E, FIG. 5 illustrates a differential magnetic sensing principle generated by a current I flowing through an extension plate 15 of the output connector. Also, like FIGS. 4A-4E, the extension plate includes a through-hole 31 that is centered in the lateral dimension of the extension plate 15, thereby forming two equally divided current constriction structures 32 and 33 that provide two parallel current paths for current to flow between the base plate 13 and the connector head 16. The two parallel current constriction structures 32 and 33 have equal dimensions (e.g., lateral dimension d) so that the currents I' flowing therethrough are equal.

The current I is equally divided into two current portions I' as it flows through the constriction structures 32 and 33 past the through-hole 31 and, thus, produce equal but opposite magnetic fields B and —B at the magnetic sensor elements 6 and 7. The magnetic fields B and —B vertically penetrate the magnetic sensor elements 6 and 7 for a differential measurement. In other words, the magnetic fields penetrate the magnetic sensor elements 6 and 7 from opposite directions The magnetic sensor 5 may be inserted into the through-hole 31 by being placed on the end of a stamp carrier 50 like a die plate, placed in the through-hole 31 in a way such that the magnetic field lines penetrate vertically through the magnetic sensor elements 6 and 7 (e.g., Hall plates). The final placement of the magnetic sensor elements 6 and 7 is inside the through-hole 31 (e.g., laterally between the internal sidewalls of the extension plate 15 formed by the through-hole 31).

Additionally, part of the through-hole 12 may extend into the top of the extension plate 15 for receiving a fastener.

Figure 6:
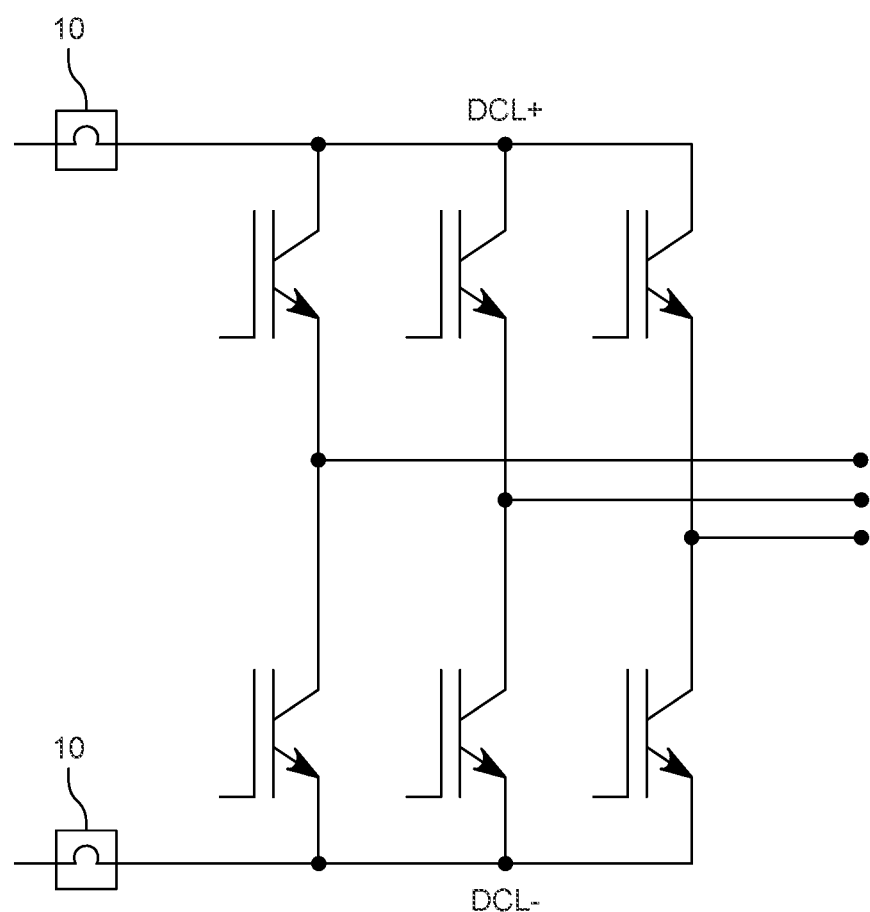
FIG. 6 is a schematic block diagram illustrating supply lines to an inverter stage according to one or more embodiments.

FIG. 6 is a schematic block diagram illustrating supply lines to an inverter stage according to one or more embodiments. The supply lines may be DC link supply rails (DCL+ and DCL−). Connectors 10A and 10B can be provided at one or both supply lines that are connected to the inverter stage. Thus, connectors 10A and 10B can be used as supply connectors as well as output connectors or load path connectors.

As a supply connector, the magnetic sensor 5 is used to measure and monitor a supply current generated by the power supply or current supply device, such as a battery. The supply connector would be structurally the same as the output connector. Thus, power supply may be regarded as a power supply device, the output current may be regarded as a supply current, and the device that receives the load current may be regarded as a load.

The supply connector may be configured to conduct a supply current of a power supply and deliver the supply current to a device, and includes a conductive frame and a magnetic current sensor. The conductive frame comprises a base structure 13, an extension structure 15, and a connector head structure 16. The base structure is coupled to a supply node of at least one primary conductor of the power supply, wherein the base structure is configured to receive the supply current from the at least one primary conductor. The connector head structure is arranged relative to the base structure, wherein the connector head structure is configured to mechanically couple the output connector to the device, and wherein the connector head structure is configured to receive the supply current from the base structure and output the supply current from the output connector to the device. The extension structure is coupled to and extends between the base structure and the connector head structure, wherein the extension structure receives the supply current from the base structure and delivers the supply current to the connector head structure. The extension structure includes a current constriction region that is configured to cause a defined magnetic field of the supply current flowing through the current constriction region at a position of a magnetic current sensor.

The magnetic current sensor is configured to generate a sensor signal based on the defined magnetic field produced by the supply current flowing through the current constriction region.

In the alternative, the base structure may be coupled to the device and the cap structure may be coupled to the supply node of the at least one primary conductor of the power supply.

While various embodiments have been disclosed, it will be apparent to those skilled in the art that various changes and modifications can be made which will achieve some of the advantages of the concepts disclosed herein without departing from the spirit and scope of the invention. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent on the independent claim.

It is further to be noted that methods disclosed in the specification or in the claims may be implemented by a device having means for performing each of the respective acts of these methods. For example, the techniques described in this disclosure may be implemented, at least in part, in hardware, software, firmware, or any combination thereof, including any combination of a computing system, an integrated circuit, and a computer program on a non-transitory computer-readable recording medium. For example, various aspects of the described techniques may be implemented within one or more processors, including one or more microprocessors, DSPs, ASICs, or any other equivalent integrated or discrete logic circuitry, as well as any combinations of such components.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments, a single act may include or may be broken into multiple sub acts. Such sub acts may be included and part of the disclosure of this single act unless explicitly excluded.

What is claimed is:

1. A power connector configured to conduct a current of a power device and deliver the current to a load, the power connector comprising:

a conductive frame comprising a base structure, an extension structure, and a connector head structure that define a current path for the current, wherein the base structure is coupled to an output node of at least one primary conductor of the power device, wherein the base structure is configured to receive the current from the at least one primary conductor, and wherein the base structure laterally extends from the extension structure in opposite lateral directions to form a first T-shape with the extension structure, wherein the connector head structure is arranged relative to the base structure, wherein the connector head structure is configured to mechanically couple the power connector to an electrical interface of the load, wherein the connector head structure is configured to receive the current from the base structure and output the current from the power connector to the electrical interface of the load, wherein a first portion of the connector head structure laterally extends from the extension structure in a first lateral direction corresponding to one of the opposite lateral directions, and wherein the first portion of the connector head structure laterally extends over a first portion of the base structure to define a first recess that is at least partially defined by a first space that extends vertically between the first portion of the connector head structure and the first portion of the base structure, wherein the extension structure is coupled to and vertically extends between the base structure and the connector head structure, wherein the extension structure is configured to receive the current from the base structure and deliver the current to the connector head structure, wherein the extension structure includes a current constriction region coupled between two current non-constriction regions, wherein the current constriction region is configured to increase a magnetic flux density of a magnetic field produced by the current flowing through the current constriction region relative to a magnetic flux density of a magnetic field produced by the current flowing through the two current non-constriction regions; and a magnetic current sensor arranged in the first recess at a position relative to the current constriction region to receive the magnetic field having the increased magnetic flux density produced by the current flowing through the current constriction region, wherein the magnetic current sensor is configured to generate a sensor signal based on the magnetic field.

2. The power connector of claim 1, wherein the extension structure includes the two current non-constriction regions, wherein a first current non-constriction region of the two current non-constriction regions is coupled to the base structure and a second current non-constriction region of the two current non-constriction regions is coupled to the connector head structure.

3. The power connector of claim 2, wherein the connector head structure extends vertically from the extension structure along the current path.

4. The power connector of claim 1, further comprising:
a circuit substrate coupled to the magnetic current sensor, the circuit substrate configured to output the sensor signal to an external device,
wherein the circuit substrate is arranged in the first recess.

5. The power connector of claim 4, wherein the circuit substrate is mechanically coupled to the extension structure.

6. The power connector of claim 1, further comprising:

a stabilization plate,
wherein a second portion of the connector head structure laterally extends from the extension structure in a second lateral direction corresponding to one of the opposite lateral directions, wherein the first portion and the second portion of the connector head structure form a second T-shape with the extension structure,
wherein the second portion of the connector head structure laterally extends over a second portion of the base structure to define a second recess defined by a second space extending vertically between the second portion of the connector head structure and the second portion of the base structure, and
wherein the stabilization plate is arranged in the second recess.

7. The power connector of claim 6, wherein the stabilization plate is mechanically coupled to the extension structure.

8. The power connector of claim 6, wherein the extension structure is interposed between the magnetic current sensor and the stabilization plate.

9. The power connector of claim 6, wherein the stabilization plate is made of a non-conductive, non-magnetic material.

10. The power connector of claim 1, wherein the magnetic current sensor comprises:
a differential pair of sensor elements that are differentially arranged with respect to the current constriction region; and
a sensor circuit configured to generate a differential sensor signal as the sensor signal based on the magnetic field produced by the current flowing through the current constriction region.

11. The power connector of claim 1, wherein the current constriction region is an S-bend structure through which the current flows, wherein the S-bend structure comprises a constriction segment that is configured to increase a current density of the current that flows through the S-bend structure to cause the received magnetic field received at the position of the magnetic current sensor to have the increased magnetic flux density.

12. The power connector of claim 11, wherein the magnetic current sensor comprises:
a differential pair of sensor elements that are differentially arranged with respect to the constriction segment of the S-bend structure; and
a sensor circuit configured to generate a differential sensor signal as the sensor signal based on the magnetic field produced by the current flowing through the current constriction region.

13. The power connector of claim 11, wherein:
the S-bend structure includes a first cut-out that laterally extends inwardly from a first lateral side of the extension structure and a second cut-out that laterally extends inwardly from a second lateral side of the extension structure, the first cut-out and the second cut-out being differentially separated on opposite sides of the constriction segment to form the S-bend structure.

14. The power connector of claim 13, wherein the constriction segment extends horizontally between the first lateral side and the second lateral side of the extension structure.

15. The power connector of claim 13, wherein the magnetic current sensor comprises:

a differential pair of sensor elements that are differentially arranged with respect to the constriction segment of the S-bend structure; and
a sensor circuit configured to generate a differential sensor signal as the sensor signal based on the magnetic field produced by the current flowing through the current constriction region,
wherein the differential pair of sensor elements includes a first sensor element that is aligned with the first cut-out and a second sensor element that is aligned with the second cut-out such that the first sensor element and the second sensor element straddle the constriction segment.

16. The power connector of claim 11, wherein the constriction segment is a middle segment of the S-bend structure that connects a base segment of the S-bend structure to the base structure and that connects a top segment of the S-bend structure to the connector head structure.

17. The power connector of claim 1, wherein the conductive frame is a one-piece integral member formed by the base structure, the extension structure, and the connector head structure.

18. The power connector of claim 1, wherein the current constriction region is a constriction segment of an I-shaped structure through which the current flows, wherein the constriction segment is configured to increase a current density of the current that flows through the constriction segment to cause the received magnetic field received at the position of the magnetic current sensor to have the increased magnetic flux density.

19. A power connector configured to conduct a current of a power device and deliver the current to a load, the power connector comprising:
a conductive frame comprising a base structure, an extension structure, and a connector head structure that define a current path for the current,
wherein the base structure is coupled to an output node of at least one primary conductor of the power device, wherein the base structure is configured to receive the current from the at least one primary conductor, wherein the base structure laterally extends from the extension structure in opposite lateral directions to form a T-shape with the extension structure,
wherein the connector head structure is arranged relative to the base structure, wherein the connector head structure is configured to mechanically couple the power connector to an electrical interface of the load, and wherein the connector head structure is configured to receive the current from the base structure and output the current from the power connector to the electrical interface of the load,
wherein the extension structure is coupled to the base structure and the connector head structure and vertically extends between the base structure and the connector head structure, wherein the extension structure receives the current from the base structure and delivers the current to the connector head structure,
wherein a first portion of the connector head structure laterally extends in a first lateral direction corresponding to one of the opposite lateral directions, wherein the first portion of the connector head structure laterally extends over a first portion of the base structure to define a first recess that is at least partially defined by a first space that extends vertically between the first portion of the connector head structure and the first portion of base structure, wherein a second portion of the connector head structure laterally extends in a second lateral direction corresponding to one of the opposite lateral directions, wherein the second portion of the connector head structure laterally extends over a second portion of the base structure to define a second recess that is at least partially defined by a second space that extends vertically between the second portion of the connector head structure and the second portion of base structure, wherein the extension structure includes a through-hole that laterally extends through the extension structure and connects the first space and the second space, wherein the current is configured to flow around the through-hole through two parallel current constriction regions; and a magnetic current sensor arranged in the through-hole, wherein the magnetic current sensor is configured to receive two magnetic fields produced by currents flowing through the two parallel current constriction regions and generate a sensor signal based on the two magnetic fields.

20. The power connector of claim 19, wherein the magnetic current sensor comprises:
   a differential pair of sensor elements that are differentially arranged with respect to the through-hole to receive the two magnetic fields that are equal but opposite in magnitude; and
   a sensor circuit configured to generate a differential sensor signal as the sensor signal based on the magnetic fields produced by the currents flowing through the two parallel current constriction regions.

21. The power connector of claim 20, wherein the differential pair of sensor elements includes a first sensor element arranged at a first lateral side of the through-hole and a second sensor element arranged at a second lateral side of the through-hole, wherein at least a portion of the through-hole is interposed between the first sensor element and the second sensor element.

22. The power connector of claim 21, wherein the current measured by the first and the second sensor elements flows in an area interposed between the first and the second sensor elements.

23. The power connector of claim 19, wherein the magnetic current sensor comprises:
   a differential pair of sensor elements that are differentially arranged inside the through-hole to receive the two magnetic fields that are equal but opposite in magnitude; and
   a sensor circuit configured to generate a differential sensor signal as the sensor signal based on the two magnetic fields produced by the currents flowing through the two parallel current constriction regions.

24. The power connector of claim 19, wherein:
   the magnetic current sensor is arranged in the first recess, in the second recess, and in the through-hole.

25. The power connector of claim 19, further comprising:
   a circuit substrate coupled to the magnetic current sensor, the circuit substrate configured to output the sensor signal to an external device,
   wherein the circuit substrate is arranged in the through-hole.

26. The power connector of claim 19, wherein the through-hole is entirely enclosed by the extension structure.

27. The power connector of claim 19, wherein the through-hole has an elongated shape whose longest dimension extends in a current flow direction of the current along which the current is configured to flow through the extension structure.

* * * * *

UNITED STATES PATENT AND TRADEMARK OFFICE
CERTIFICATE OF CORRECTION

| | |
|---|---|
| PATENT NO. | : 11,841,383 B2 |
| APPLICATION NO. | : 17/487314 |
| DATED | : December 12, 2023 |
| INVENTOR(S) | : Theodor Kranz et al. |

It is certified that error appears in the above-identified patent and that said Letters Patent is hereby corrected as shown below:

In the Claims

In Claim 11, Column 17, Line 39, "cause the received magnetic field" should be changed to -- cause magnetic field --;

In Claim 18, Column 18, Line 28, "cause the received magnetic field" should be changed to -- cause the magnetic field --.

Signed and Sealed this
Thirtieth Day of January, 2024

Katherine Kelly Vidal
*Director of the United States Patent and Trademark Office*